United States Patent [19]
Lee et al.

[11] Patent Number: 5,476,693
[45] Date of Patent: Dec. 19, 1995

[54] METHOD FOR THE DEPOSITION OF DIAMOND FILM BY HIGH DENSITY DIRECT CURRENT GLOW DISCHARGE

[75] Inventors: Wook-Seong Lee; Young-Joon Baik; Kwang Y. Eun, all of Seoul, Rep. of Korea

[73] Assignee: Korea Institute of Science and Technology, Seoul, Rep. of Korea

[21] Appl. No.: 348,110

[22] Filed: Nov. 25, 1994

[30] Foreign Application Priority Data

Dec. 29, 1993 [KR] Rep. of Korea ............... 30636/1993

[51] Int. Cl.⁶ ............................ B05D 3/06; C23C 16/26
[52] U.S. Cl. .................. 427/577; 427/249; 427/122; 118/723 HC; 118/724; 423/446; 428/408
[58] Field of Search ..................... 427/577, 249, 427/122; 118/723 HC, 724; 423/446; 156/DIG. 68; 428/408; 117/920

[56] References Cited

U.S. PATENT DOCUMENTS

| | | | |
|---|---|---|---|
| 5,007,373 | 4/1991 | Legg et al. ........................ | 118/723 |
| 5,169,452 | 12/1992 | Nakayama et al. ............... | 118/723 |

FOREIGN PATENT DOCUMENTS 2-133398  5/1990  Japan .

OTHER PUBLICATIONS

"Growth of Diamond Thin Films by de Plasma Chemical Vapor Deposition and Characteristics of the Plasma", Kazuhiro Suzuki et al., Jap. J. Appl. Phys., vol. 29, 1990, p. 153.
"Diamond Synthesis by DC Plasma CVD Method", K. Suzuki et al., Surface Technology, 42 (1991), p. 1197.
"Aspects of Diamond Deposition by Anomalous Pulsed D.C. Glow–Discharge–Activated Chemical Vapor Deposition", D. Satrapa et al., Surface and Coatings Technology, 47 (1991), pp. 59–68.
"Investigation of Rotating D.C. Discharge for Diamond Deposition", M. Nesladek, Diamond and Relationed Materials, 2, (1993), pp. 357–360.
Proceedings of the Second International Conference, "New Diamond Science and Technology", Russell Messier et al., Sep. 23–27, 1990, pp. 443–449.

*Primary Examiner*—Roy V. King
*Attorney, Agent, or Firm*—Lowe, Price, LeBlanc & Becker

[57] ABSTRACT

There is disclosed a method for depositing a diamond film on a substrate which utilizes high density direct current glow discharge at a glow-arc transition region to form plasma between a cathode and an anode in a reactor, wherein the cathode maintains its temperature at a range of 2,100 to 2,300° C. and is composed of a plurality of U-shaped filaments which are aligned parallel to one another to form an array and each of which is made by bending a conductive wire.

3 Claims, 5 Drawing Sheets

CONVENTION ART

METHOD FOR THE DEPOSITION OF DIAMOND FILM BY HIGH DENSITY DIRECT CURRENT GLOW DISCHARGE

BACKGROUND OF THE INVENTION

1. Field of the Invention

The present invention relates, in general, to a method for the synthesis of diamond film utilizing high density direct current glow discharge and, more particularly, to a method for depositing a diamond film by high density direct current glow discharge employing a plurality of separate, space-distant U-shaped filaments as a cathode and keeping the temperature of the cathode high, thereby uniformly producing high quality diamond film on a large area of substrate.

2. Description of the Prior Art

Direct current (DC) glow discharge chemical vapor deposition (CVD), a vapor synthesis technique representative for diamond film synthesis, is well known to those skilled in the art.

In order to better understand the background of the present invention, a conventional method is described with reference to FIGS. 1 through 3.

Referring initially to FIG. 1, there is shown a DC glow discharge CVD apparatus for synthesizing a diamond film. As shown in this figure, the DC glow discharge CVD apparatus is composed of a reactor 1 having a cathode 2 supported by a cathode holder 7 through a cathode suspending bar 6 and an anode 3 opposite to the cathode 2 to a distance, a vacuum pump 4 to keep the pressure of the reactor low, a gas supplier 5 to introduce material gas into the reactor, and a DC power supplier 8 connected with the cathode holder 7. Using such DC glow discharge deposition apparatus, a diamond film is synthesized on a substrate 9. In detail, a voltage formed by the DC power supplier 8 generates plasma between the cathode 2 and the anode 3 which in turn decomposes the material gas introduced from the gas supplier 5.

When a diamond film is synthesized by use of the apparatus, in order to keep the deposition rate of the diamond film high, for example, up to several tens of μm/h, the discharge must be carried out in a glow-arc transition range under such a condition that the pressure of the material gas is in a range of about 100 to about 200 torr and discharge current density is not less than 0.5 A/cm$^2$ (see Japanese Patent Publication No. Heisei 2-133398).

During such high density glow discharge, there is apparently formed a luminous region over the substrate 9 atop the anode 3, which is called a positive column (PC) (see Kazuhiro Suzuki, Atsuhito Sawabe and Inuzuka, Jap. J. Appl. Phys., 29 (1990) 153).

Since the diamond film is coated only on an area of the substrate contacted with the positive column or on an area of the substrate adjacent to the positive column, the uniform thickness and properties of the diamond film deposited demand that the positive column be formed uniformly and symmetrically to the central axis of the substrate.

Meanwhile, in diamond deposition technology using vapor synthesis process, it is very industrially important that the diamond film is deposited as widely and thickly as possible as to have sufficient mechanical durability. Particularly, in order to use the diamond film formed by vapor synthesis process for an infrared optical window, a brazing-type cutting tool, a semiconductor substrate or a heat sink, it should be a free-standing film having a thickness of about 100 to about several hundred microns.

It takes about 50 hours to obtain a 1 mm thick diamond film even under a deposition rate of 20 μm/h, the fastest rate of the DC glow discharge method reported thus far. For stable deposition for such a long time, it is required that the plasma not be extinguished and the discharge current be stably maintained without large deterioration. However, when a diamond film is synthesized by the conventional high density glow discharge, an irregular arc is suddenly generated between the cathode and the substrate, making the positive column be extinguished. Therefore, it is impossible in practice to stably deposit the diamond film for a long time with the conventional high density glow discharge.

Existing researchers have recognized that the extinction of the plasma by sudden generation of such arc is attributed to the electric properties of discharge and have made many attempts to cope with it in an aspect of electric circuits. For example, there were suggested use of a ballast resistance having a large capacity of around 1,000 ohms [K. Suzuki and T. Inuzuka, Surface Technology, 42 (1991) 1190, use of direct current pulse supplier in place of direct current power supplier [D. Satrapa, R. Haubner and B. Lux, Surface and Coatings Technology, 47 (1991) 59], and application of magnetic fields to both electrodes [N. Nesladek, "Investigation of rotating DC-discharge for diamond deposition", in Diamond 1992, Proc. Third Int. Conf. on The New Diamond Science and Tech. jointly with 3rd European Conf. Diamond, Diamond-like and Related Coatings, Aug. 31, Sep. 4, 1992, Heidelberg, Germany, Ed. by P. K. Bachmann, A. T. Collins, M. Seal, Elsevier Sequoia, (1993) 357].

However, there are pointed out many problems in their attempts. In detail, a ballast resistance having a large capacity consumes too large a quantity of power at the ballast resistance to deposit a diamond film on a large area of substrate at a high rate, in practice.

The direct current pulse supplier is disadvantageous in many aspects. First, a pulse generator for direct current pulse is high in cost as compared with ordinary direct current suppliers. Since the pulse generator supplies only a small quantity of direct current power per hour, its use causes the slow deposition rate. Moreover, there is no report that DC pulse generator is successfully employed to produce diamond film on a large substrate with a high growth rate.

With regard to the application of magnetic fields to both electrodes, it is troublesome in that a circuit for forming magnetic fields is additionally installed in the both electrodes. What is still worse, the application of magnetic fields to both electrodes can not prevent the generation of an arc completely, either.

Meanwhile, a diamond film deposition method using the conventional high density DC glow discharge has difficulty in forming a positive column uniformly on a large area of substrate having a diameter of 3 to 5 cm and thus, is almost incapable of depositing a diamond film which has uniform thickness and properties for a larger area of substrate. Neither can it synthesize a diamond film with a sufficient thickness.

When a diamond film is synthesized by the high density direct current discharge technology, it is recognized that the area of substrate deposited with the diamond film has close relations with the size and shape of the cathode. Such conventional direct current glow discharge technology mainly employs a cathode with the shape of a disk, rod or tube.

Now, referring to FIGS. 2A and 2B, there are illustrated plasma phases formed by the conventional high density direct current glow discharge technology employing a disk-shaped cathode which are dependent on the diameter of the cathode. FIG. 2A shows a small cathode with a diameter of about 1 cm, while FIG. 2B shows a large cathode with a diameter of 3 to 5 cm.

As shown in FIG. 2A, a positive column 13 formed between a cathode 12 supported by cathode support bar 11 and a substrate 10 is uniform and symmetrical to the central axis of the substrate 10. However, since the size of the positive column 13 formed is small, the area deposited is limited.

The diameter of the positive column is proportional to that of the cathode to some extent. Accordingly, it is expected that a large diameter of the cathode, for example, a 3 to 5 cm diameter, would make a large positive column proportional to the diameter. However, the corresponding area of the anode to the cathode 12' can not be uniformly heated but is only locally heated by the discharge current, in practice, so that the upper portion of the positive column 13' is biased toward a heat-concentrated region, as shown in FIG. 2B. Therefore, it is impossible to uniformly deposit a diamond film on a large area of substrate with a cathod of large diameter. This trend is aggravated as the diameter of the cathode becomes larger.

For deposition of diamond film on large areas, it is required that the area of the cathode be augmented proportionally to that of the substrate, which casts a serious restriction on the subject.

To prevent the bias phenomenon of the plasma, the cathode should be uniformly heated. For this, it is preferred to keep the specific surface area of the cathode as large as possible.

A representative shape having the largest specific surface area yet maintaining its durability is a filament shape. For example, spiral filament is widely used in various electrical heaters and for diamond vapor deposition technique, such as hot filament technique or EVCVD technique.

Referring to FIG. 3, there is shown a spiral filament which is employed as a cathode in a high density direct current glow discharge apparatus. FIG. 3A shows an early stage of discharge whereas FIG. 3B shows a later stage of discharge. FIGS. 3C and 3D each illustrates a supporting structure of filament.

As shown in FIG. 3A, a spiral filament 14 with a diameter of about 20 to about 30 mm is newly mounted and, within several hours, a barrel-shaped positive column 16 is formed on a large area of a substrate 15 having a diameter of about 30 to about 50 mm symmetrically to the central axis of the substrate 15. Thus, a uniform deposition is accomplished by the spiral filament if its operation is finished within several hours.

However, with the lapse of time, the spiral filament is twisted seriously. After some time, as shown in FIG. 3B, the twisted filament 14' makes a positive column 16' biased toward one side, preventing a diamond film from being deposited uniformly.

Now, a description will be made in conjunction with the reason for the biased positive column.

The larger the diameter of spiral filament is, the more serious is temperature difference between a lower portion of the filament, the portion being in contact with the positive column and an upper portion of the filament, the portion being distant therefrom. For example, even when the lower portion is heated to above 2,100° C., the upper portion has a temperature of about 1,000° to about 1,300° C. Thus, there is an extreme temperature difference ranging from about 800° to about 1,100° C. therebetween.

Generally, a spiral filament is made of a metal having a high melting point, such as tungsten, tantalum and the like. It has been reported that such filament is carburized in a high density of a diamond film synthesizing atmosphere at a temperature of 2,100° to 2,300° C. At this time, the nature of carburization of the filament is different according to the local temperature. In other words, there are scarcely observed cracks or splits in the lower portion of filament heated to above 2,100° C., whereas many cracks and splits are generated in the upper portion of filament having a temperature lower by several hundred Celsius degrees than that of the lower portion.

Since the conventional spiral filament is structured to be a single body of one conductive wire, even if no deformation occurs in the lower portion during the carburization, any deformation at a region of the upper portion causes the total filament to twist. As a result, the positive becomes biased, for example, like FIG. 3B.

SUMMARY OF THE INVENTION

An object of the present invention, therefore, is to overcome the above problems encountered in prior arts and to provide a method for depositing a diamond film by high current density DC glow discharge, capable of both forming a positive column between a cathode and a substrate uniformly and keeping the positive column stable for a long time, thereby synthesizing a high quality large-area and thick diamond film.

The above object could be accomplished by a provision of a method for depositing a diamond film on a substrate which utilizes high density direct current glow discharge at a glow-arc transition region to form plasma between a cathode and an anode in a reactor, wherein the cathode maintains its temperature at a range of 2,100° to 2,300 ° C. and is composed of a plurality of U-shaped filaments which are aligned parallel to one another to form an array and each of which is made by bending a conductive wire, whereby no arc is generated between the cathode and the anode during diamond film synthesis.

In accordance with an aspect of the present invention, the method is characterized in that, in consideration of a fact that nonuniform deposition results from the biased formation of a positive column caused by the carburization of conventional spiral filament, a plurality of U-shaped filaments each of which is made by bending a conductive wire are aligned parallel to one another and suspended by a solid filament holder, to form an army.

In accordance with another aspect of the present invention, the method is characterized in that a contact portion of the cathode at which the U-shaped filaments come into contact with the plasma is allowed to have a temperature of 2,100° to 2,300° C. steadily, to prevent the deposition of solid carbon and thus, the sudden generation of arc.

In accordance with a further aspect of the present invention, the method is characterized in that, along with keeping the temperature of the cathode high, for example, 2,100° to 2,300° C., the cathode is shaped properly to maintain the high temperature.

Under the same conditions, a reaction gas comprising a small portion of oxygen prevented solid carbon from being deposited on the cathode.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

Figure 1:
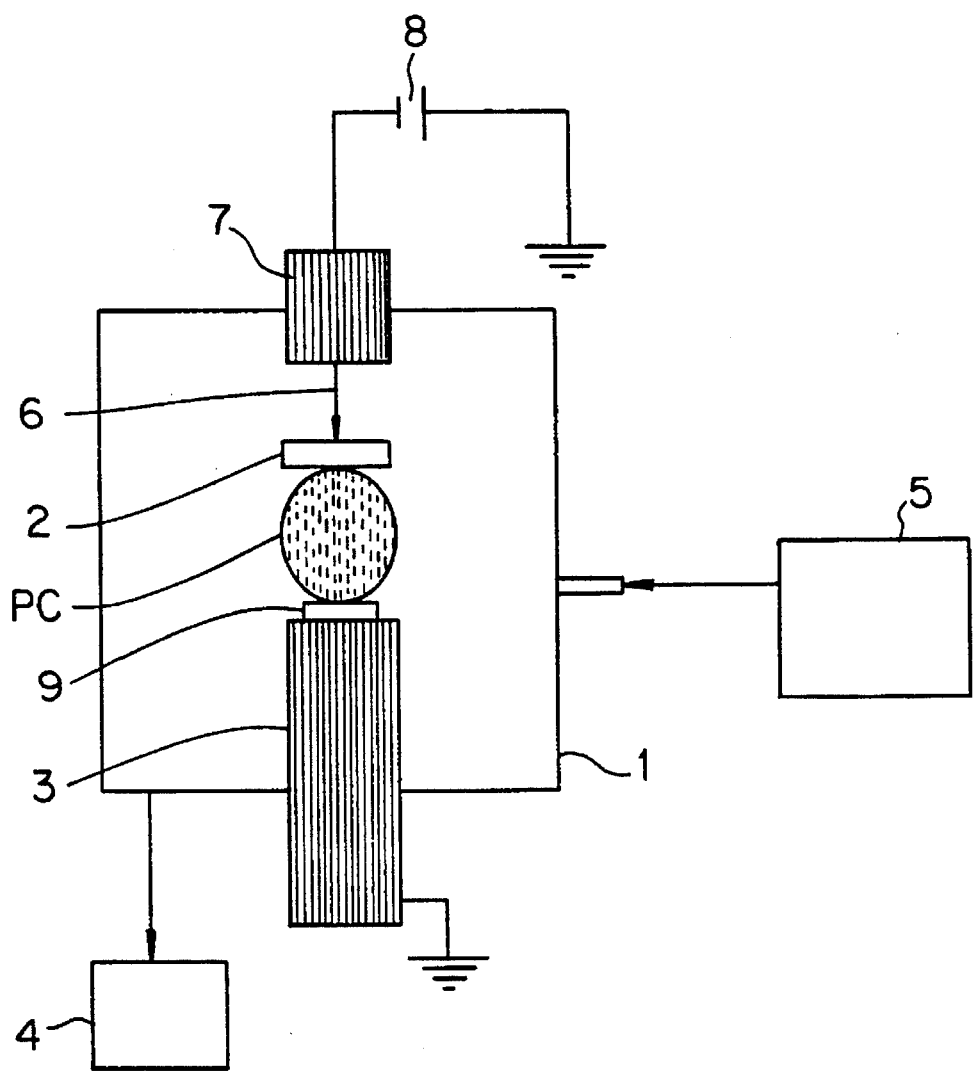
FIG. 1 is a schematic diagram showing a direct current glow discharge deposition apparatus for synthesizing a diamond film.
Figure 2A:
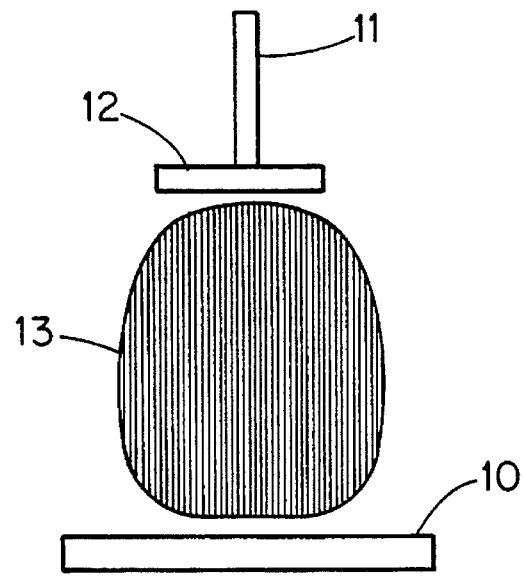
FIG. 2A is a schematic view showing a formation aspect of plasma in case of using a small disk-type cathode.
Figure 2B:
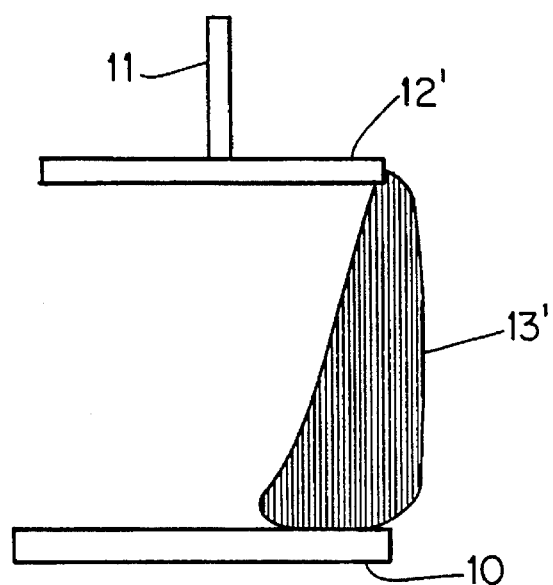
FIG. 2B is a schematic view showing a formation aspect of plasma in case of using a large disk-type cathode.
Figure 3A:
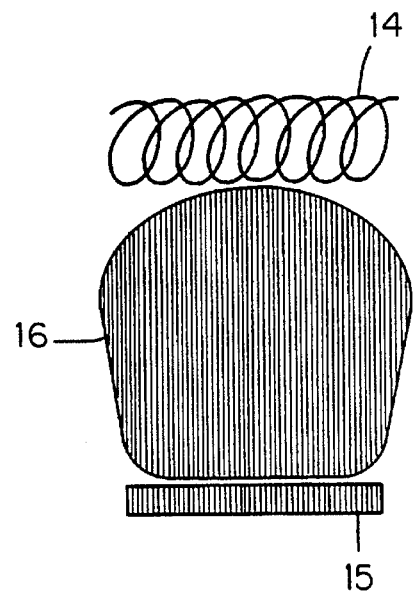
FIG. 3A is a schematic view showing an aspect of plasma which is formed when high density direct current discharge is performed within several hours employing a spiral filament as a cathode.
Figure 3B:
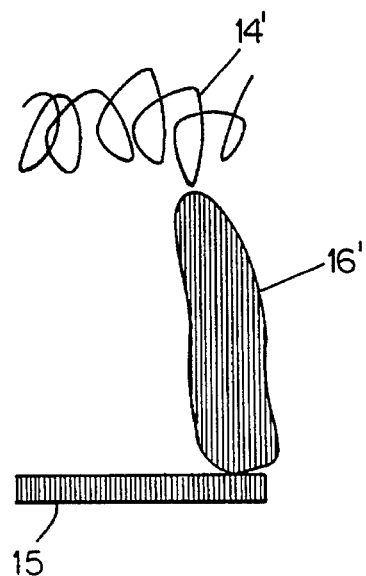
FIG. 3B is a schematic view showing an aspect of plasma which is formed when high density direct current discharge is performed for more than several hours employing a spiral filament as a cathode.
Figure 3C:
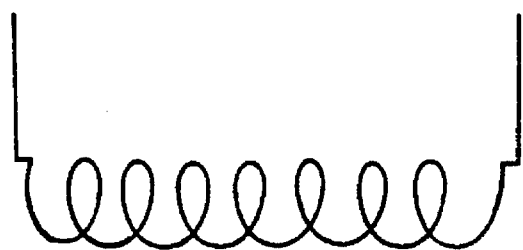
FIGS. 3C and 3D are schematic views showing support structures for the filament, respectively.
Figure 3D:
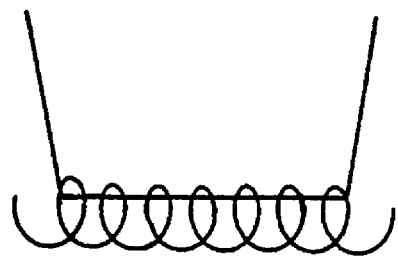
Figure 4A:
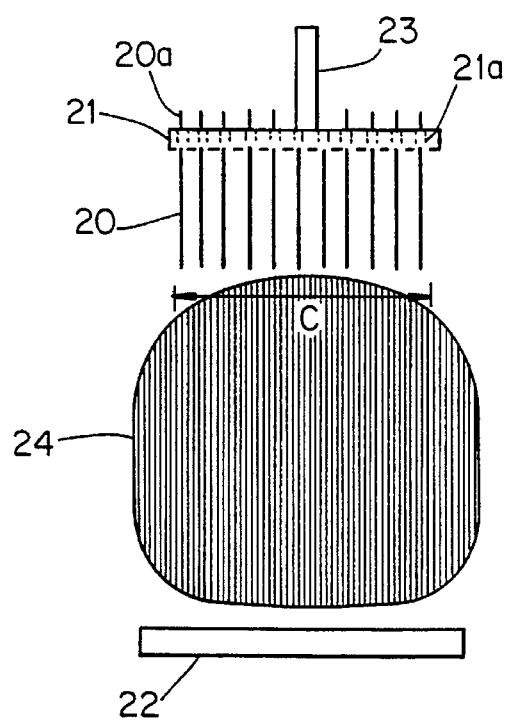
FIG. 4A is a schematic front view showing a formation aspect of plasma and a structure of a cathode comprising a plurality of U-shaped filaments, according to the present invention.
Figure 4B:
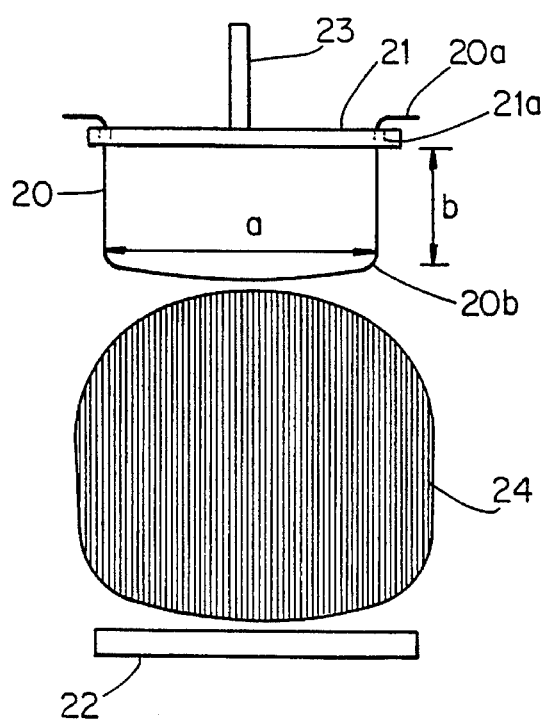
FIG. 4B is a schematic side view showing a formation aspect of plasma and a structure of a cathode comprising a plurality of U-shaped filaments, according to the present invention.

The application of the preferred embodiment of the present invention will be best understood by referring FIG. 4A and 4B of the accompanying drawings, wherein like reference numerals and letters are used for like and corresponding parts, respectively.

Referring to FIGS. 4A and 4B, there is illustrated a cathode structure according to an embodiment of the present invention. As shown in these figures, a plurality of conductive wires which each has a diameter of 0.5 to 1 mm and is composed of a high melting point metal (tungsten or tantalum) are bended, to form a plurality of U-shaped filaments 20 which are suspended by a filament holder 21. The suspension of the filament 20 is accomplished by inserting each of opposite upper ends 20a thereof into an insertion hole 21a and horizontally bending the ends protruded from the holes. At this time, it is preferred to make the U-shaped filaments merely suspended by the filament holder 21 so as for the filament carburized not to be mechanically restrained by the filament holder 21.

As a result, a plurality of U-shaped filaments 20 are supported through the insertion holes 21a which form two lines along opposite edges of the filament holder 21, so that the filaments 20 are suspended parallel to one another, keeping the distance therebetween constant.

In order to prevent electric fields from being concentrated, each of the opposite lower corner portions 20b of the U-shaped filament 20 preferably forms a gentle curve. In addition, it is preferred that the diameter of the insertion hole 21 is sufficiently larger than that of the U-shaped filament 20 in consideration of volume expansion in the filament during its carburization.

Meanwhile, the horizontal length of the U-shaped filament 20 and the total alignment distance c are the same as or a little shorter than the diameter of the substrate 22. The vertical length b of the U-shaped filament 20 may be selected so as not to largely depart from the horizontal length a.

As mentioned above, the conventional spiral filament of single body comprising one conductive wire begins to be twisted in its upper portion which has a temperature lower than that of its lower portion. On the contrary, since the cathode according to the present invention is composed of a plurality of separate, independent U-shaped filaments 20 and the upper portion thereof is fixed to the filament holder 21, there are no low temperature portions therein which cause twisting.

Even if there occurs a little deformation in each of the U-shaped filaments as they are carburized, such deformation is confined within each separate, independent U-shaped filament, so that the total alignment thereof is not affected. Accordingly, in the present cathode structure comprising of a plurality of separate, independent U-shaped filaments, there are no such serious twists as generated in the conventional spiral filament.

In addition, because each of the U-shaped filaments 20 of the present invention is made of a thin conductive wire having a diameter of around 1 mm, it is uniformly heated as compared with the conventional disk, bar or tube-shaped cathode.

Independent of the amount of electrical power supplied to both electrodes, the temperature of the U-shaped filament of the present invention can be controlled by varying both a contact degree between a holder support bar 23 and the filament holder 21 and the heat capacity of the filament holder 21, thereby maintaining the total temperature of the U-shape filament 20 at not less than about 2,100° C.

In accordance with the present invention, high density direct current discharge can produce a positive column in such a way that it comes into uniform contact with each filament, depositing uniform diamond film on a large area with a diameter of at least 5 cm.

The positive column produced by the method of the present invention, as shown in FIG. 4, is not localized but distributed uniformly in the array of the U-shaped filaments and takes a barrel form of which the longest diameter is similar to that of the cathode.

Based on intensive and thorough studies by the present inventors, it has been recognized that solid carbon deposited on the cathode causes the generation of an arc which, in turn, instabilizes and extinguishes the plasma during the synthesis of diamond film. In order to prevent the deposition of solid carbon, temperature is maintained at about 2,100° to about 2,300° C. in the contact portion of the U-shaped filament with the plasma, according to the present invention. As a result, an arc can be completely prevented without using additional arc prevention equipment.

With the conventional high density direct current glow discharge technology in which the temperature of the cathode is lower by several hundred Celsius degrees than that of the present invention, on the other hand, solid carbon must be deposited on the surface of cathode under the condition that a diamond film is synthesized. Accordingly, with the lapse of time after beginning diamond synthesis, an arc is suddenly generated between the cathode and the anode by the conventional technology, instabilizing and finally extinguishing the discharge.

In the case that there is no carbon source in a reactor, for example, the atmosphere thereof is composed of only hydrogen, no arc is generated even under the same voltage, current and gas pressure and no solid carbon on the surface of the cathode is observed. Accordingly, it is comprehended that the generation of an arc between the cathode and the substrate or between a cathode and an anode is attributed to the deposition of solid carbon on the cathode.

In accordance with the method of the present invention, elevation of the temperature in the cathode to a range of 2,100° to 2,300° C. brings about many additional advantages as follows. To begin with, the size of a ballast resistance can be allowed to be reduced into 100 to 50 ohms even under a diamond synthesis condition when a mixed gas including hydrocarbon gas is used for the reaction gas. In addition, an arc is never generated even when an ordinary DC supplier is employed in place of a DC pulse generator, which results in no deposition of solid carbon on the cathode, keeping the discharge stable.

The low limit of temperature at which solid carbon is not deposited on the cathode surface during diamond film synthesis is dependent on the content of both hydrocarbon gas and oxygen in the synthesizing atmosphere. The prevention of deposition of solid carbon on the cathode, which brings about no arc, can be accomplished at lower temperature of the cathode if a small amount of oxygen is added to the reaction gas. The amount of oxygen depends on that of methane in the reaction gas, and is about 0.1 to 50 volume % of hydrocarbon gas. The low limit of temperature at which solid carbon is not deposited on the cathode becomes lower as the concentration of hydrocarbon gas is reduced or as the concentration of oxygen is increased.

In a hot filament CVD technology wherein the heat of filament caused by the supply of electricity is used as a gas-decomposing source, the deposition of solid carbon occurs in some temperature range, which is dependent on the carbon amount in the atmosphere and on the addition of oxygen. This dependence suppots a conception of the present invention by supported by a report saying that it is expected that addition of oxygen reduces the temperature range generating the deposition of solid carbon (M. Sommer and F. W. Smith, New Diamond Science and Technology, (1991) MRS Int. Conf. Proc., 443).

As described hereinbefore, the method according to the present invention is notably distinguished by controlling the cathode shape and temperature to form a positive column uniformly on a large area of a surface having a diameter of over 5 cm, whereby the column can be stably maintained for a long time and thus there can be deposited a high quality diamond film with a thickness of several hundred of μm to 1 mm and with a diameter of over 5 cm.

The preferred embodiments of the present invention will now be further described with reference to specific examples.

Other features, advantages and embodiments of the invention disclosed herein will be readily apparent to those exercising ordinary skill in the art after reading the foregoing disclosures. In this regard, while specific embodiments of the invention have been described in considerable detail, variations and modifications of these embodiments can be effected without departing from the spirit and scope of the invention as described and claimed.

EXAMPLE 1

Using a tantalum conductive were with a diameter of 0.7 mm, such a cathode as is shown in FIG. 4 was made. A voltage was applied between the cathode and the anode under a gas pressure of 160 mbar in a reaction atmosphere comprising 3% of methane and hydrogen, to form plasma. When the applied voltage between opposite electrodes was in a range of 700 V and current density was in a range of 1.5 $A/cm^2$, the cathode temperature was in a range of 2,300° C.

An observation revealed that there was no deposition of solid carbon on the cathode while a diamond film was uniformly deposited on a substrate with a diameter of 30 mm. Deposition rate was 20 μm per hour. Even until the diamond film thickness reached about 1 mm, the deposition rate and the shape of plasma was stably maintained without any change.

The synthesized diamond film was white and subjected to Raman spectrum analysis which showed a half maximum (FWHM) value of at least 3.0.

EXAMPLE 2

A diamond film was synthesized in a manner similar to that of Example 1, except that the temperature of filament cathode was maintained at 1,800° C.

Solid carbon was deposited on a lower part of the filament and, during the synthesis, there was generated an arc due to which the plasma was extinguished. Thus, it was impossible to deposit the diamond film for a long time.

EXAMPLE 3

Under a condition similar to that of Example 1, solid carbon was deposited on the cathode even when the temperature of filament was 2,160° C. if a reaction gas was composed of 3% of methane and 97% of hydrogen without oxygen. In this case, the thickness of solid carbon increased with time.

Under the same conditions, a reaction gas comprising 1% of oxygen prevented solid carbon from being deposited on the cathode.

What is claimed is:

1. A method for depositing a diamond film having a thickness up to 1 mm on a substrate which utilizes high density direct current glow discharge at a glow-arc transition region to form a plasma without generating arcs between a cathode and an anode in a reactor, which method comprises depositing the diamond film using a cathode comprising a plurality of U-shaped filaments which are aligned parallel to one another to form an array and each of which is made by bending a conductive wire and opposite ends of said U-shaped filaments are inserted into insertion holes which form two lines along opposite edges of a filament holder, in such a way that said U-shaped filaments are merely suspended parallel to one another, keeping the distance therebetween constant.

2. The method set forth as claim 1, wherein the contact portion of said cathode at which the U-shaped filaments come into contact with the plasma maintains its temperature at a range of 2,100° to 2,300° C. during deposition.

3. The method set forth as claim 1, wherein a reaction gas comprising hydrocarbon gas, hydrogen gas and oxygen in the amount of 0.1 to 50 volume % of the hydrocarbon gas is used.

\* \* \* \* \*